(12) United States Patent
Kyouda et al.

(10) Patent No.: US 8,083,959 B2
(45) Date of Patent: Dec. 27, 2011

(54) SUBSTRATE PROCESSING METHOD, SUBSTRATE PROCESSING SYSTEM, AND COMPUTER-READABLE STORAGE MEDIUM

(75) Inventors: Hideharu Kyouda, Koshi (JP); Junichi Kitano, Koshi (JP); Osamu Miyahara, Koshi (JP); Kenji Tsutsumi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1034 days.

(21) Appl. No.: 11/958,839

(22) Filed: Dec. 18, 2007

(65) Prior Publication Data
US 2008/0160781 A1    Jul. 3, 2008

(30) Foreign Application Priority Data
Dec. 27, 2006   (JP) .................................. 2006-351555

(51) Int. Cl.
*B44C 1/22* (2006.01)
(52) U.S. Cl. .............. 216/41; 216/40; 134/1.2; 438/716
(58) Field of Classification Search ........... 438/7, 9.706, 438/710, 712, 716, 717; 216/40, 41, 44; 430/312, 313; 134/1.2
See application file for complete search history.

(56) References Cited

U.S. PATENT DOCUMENTS

| 6,519,498 B1 * | 2/2003 | Jevtic et al. ................. 700/101 |
| 6,930,061 B2 * | 8/2005 | Cheung et al. ............... 438/789 |
| 2007/0003878 A1 * | 1/2007 | Paxton et al. ................. 430/311 |

FOREIGN PATENT DOCUMENTS

| JP | 6-104170 | 4/1994 |
| JP | 6-318541 | 11/1994 |
| JP | 7-147219 | 6/1995 |
| JP | 8-222543 | 8/1996 |

OTHER PUBLICATIONS

Japanese Office Action issued Apr. 5, 2011, in Patent Application No. 2006-351555 (with English-language translation).

* cited by examiner

*Primary Examiner* — Lan Vinh
(74) *Attorney, Agent, or Firm* — Oblon, Spivak, McClelland, Maier & Neustadt, L.L.P.

(57) ABSTRACT

In the present invention, a plurality of rounds of patterning are performed on a substrate. In a patterning system, the substrate on which a first round of patterning has been performed is transferred to a planarizing film forming unit, where a planarizing film is formed above the substrate. The substrate is then transferred to the patterning system and subjected to a second round of patterning. The time from the completion of the forming processing of the planarizing film to the start of the second round of patterning is managed to be constant among the substrates. According to the present invention, in the pattern forming processing of performing a plurality of rounds of patterning, a pattern with a desired dimension can be stably formed above the substrate.

8 Claims, 5 Drawing Sheets

SUBSTRATE PROCESSING METHOD, SUBSTRATE PROCESSING SYSTEM, AND COMPUTER-READABLE STORAGE MEDIUM

BACKGROUND OF THE INVENTION

1. Field of the Invention

The present invention relates to a substrate processing method, a substrate processing system, and a computer-readable storage medium.

2. Description of the Related Art

In a process of manufacturing a semiconductor device, for example, patterning is performed for forming a predetermined pattern in a specific film to be processed above a wafer. In the patterning of the film to be processed, for example, a resist coating treatment of applying a resist solution to the top of the film to be processed above the wafer to form a resist film, exposure processing of applying light in a predetermined pattern to the resist film above the wafer surface to expose the resist film, heating processing of heating the wafer to accelerate the chemical reaction in the exposed resist film (post-exposure baking), developing treatment of developing the heated resist film and so on are performed in sequence using the photolithography technique, whereby a predetermined resist pattern is formed in the resist film above the wafer surface. Thereafter, the film to be processed is etched, for example, using the resist pattern as a mask, and the resist pattern is then removed, whereby a predetermined pattern is formed in the film to be processed.

To form a finer pattern to further miniaturize the semiconductor device, conventionally the wavelength of light for use in the exposure processing in the above-described patterning has been increasingly reduced. Only by the method of increasingly reducing the wavelength for exposure, however, it is difficult to form a fine semiconductor device at a level of, for example, 32 nm or 45 nm. Hence, it is proposed to perform a plurality of rounds of patterning, for example, on the film to be processed at the same layer above the wafer surface to form a finer pattern, so as to miniaturize the semiconductor device (Japanese Patent Application Laid-open No. H7-147219).

If a second round of patterning is started to form a resist film above the surface of the wafer, for example, immediately after a first round of patterning is completed, the resist film may not be formed flat due to projections and depressions of the pattern in the first round above the surface of the wafer. If the resist film is not formed flat as described above, a poor condition may occur, such as deviation of focus of exposure during subsequent exposure processing. Therefore, it is desirable to form a film for flattening (hereinafter, referred to as a "planarizing film") the surface of the substrate after the preceding round of patterning is completed and before the subsequent round of patterning is started.

SUMMARY OF THE INVENTION

In the case of performing the forming processing of a planarizing film between the successive rounds of patterning using an existing technique, it is conceivable that a plurality of wafers on which the preceding round of patterning has been completed are successively housed into a cassette and transferred as a unit of a cassette to a planarizing film forming unit. Further, it is also conceivable that the wafers for which the forming processing of the planarizing film in the planarizing film forming unit has been completed are successively housed into a cassette, and transferred as a unit of a cassette from the planarizing film forming unit to a unit that performs patterning.

In such a case, however, time management for each of the wafers is usually difficult, thus causing time from the formation of the planarizing film to the start of the subsequent round of patterning to be different for each wafer.

This makes the volatilization volume of a volatile component in the planarizing film and the amount of moisture or the like adhering to the planarizing film differ from wafer to wafer, resulting in, for example, variation in acid concentration of the planarizing film. As described above, for example, the variation in acid concentration of the planarizing film causes an unstable shape of the resist pattern which is to be formed using the planarizing film as a base. This is because the shape of the resist pattern formed by the exposed portion dissolving with, for example, an alkaline developing solution depends on the acid concentration of the resist film, and the acid concentration of the resist film is also affected by the acid concentration of the base planarizing film.

When the shape of the resist pattern becomes unstable to fail to form a resist pattern with a desired dimension as described above, etching on the film to be processed using the resist pattern as a mask also varies, eventually leading to failure to stably form the pattern with a desired dimension.

The present invention has been developed in consideration of the above points, and its object is to finally stably form a pattern with a desired dimension above a substrate such as a wafer in a pattern forming processing of performing a plurality of rounds of patterning.

To attain the above object, the present invention is a substrate processing method of performing a plurality of rounds of patterning on a film to be processed located at a same layer above a surface of a substrate, the processing being performed on a plurality of substrates, the method including the step of forming a planarizing film above the substrate between successive rounds of patterning of the plurality of rounds of patterning. In the present invention, time from completion of the step of forming a planarizing film to start of subsequent round of patterning is made constant among the substrates.

According to the present invention, the time from completion of the step of forming a planarizing film to start of subsequent round of patterning is made constant among the substrates, so that, for example, the volatilization volume of a volatile component in the planarizing film and the amount of moisture or the like adhering to the planarizing film are constant, resulting in the constant acid concentration of the planarizing film among the substrates. As a result, the shape of a resist pattern to be formed on the planarizing film is stably formed having a desired dimension, so that a pattern with a desired dimension is finally stably formed in the film to be processed.

The present invention according to another aspect is a substrate processing system for performing a plurality of rounds of patterning on a film to be processed located at a same layer above a surface of a substrate, the processing being performed on a plurality of substrates, the system including: a patterning system for performing each of the rounds of patterning; a planarizing film forming unit for forming a planarizing film above the substrate between successive rounds of patterning of the plurality of rounds of patterning; a substrate housing unit capable of temporarily housing the substrate transferred from the planarizing film forming unit to the patterning system; and a substrate transfer unit for transferring the substrate between the planarizing film forming unit, the patterning system, and the substrate housing unit.

The present invention according to still another aspect is a computer-readable storage medium storing a program running on a computer of a control unit for controlling a substrate processing system to execute the above-described substrate processing method in the substrate processing system.

According to the present invention, a pattern with a desired dimension can be stably formed in a film to be processed above a substrate by a plurality of rounds of patterning, thus promoting the miniaturization of a semiconductor device.

DETAILED DESCRIPTION OF THE INVENTION

Figure 1:
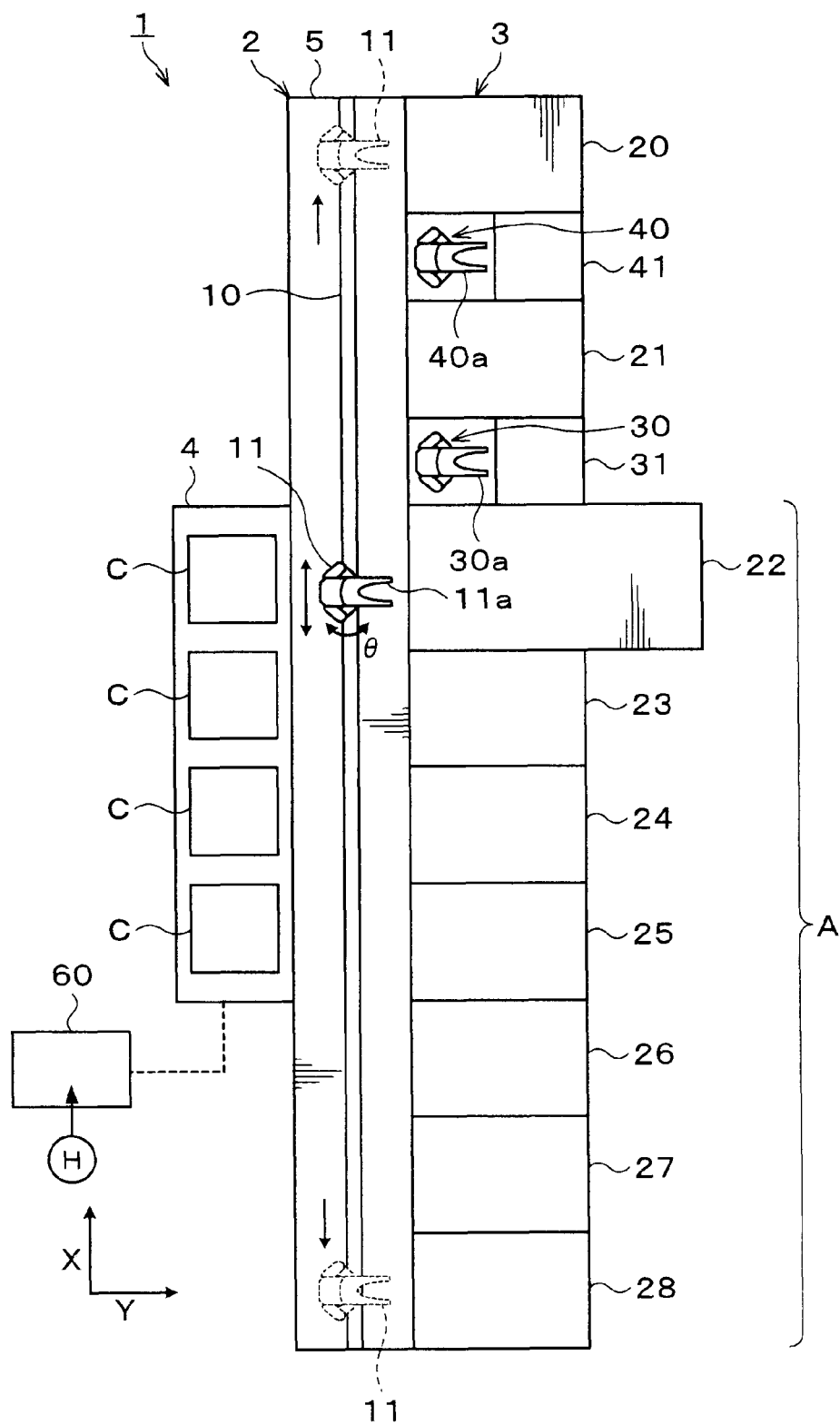
FIG. 1 is a plan view showing a configuration of a substrate processing system.

Hereinafter, a preferred embodiment of the present invention will be described. FIG. 1 is a plan view showing the outline of a configuration of a substrate processing system 1 according to this embodiment.

The substrate processing system 1 has, as shown in FIG. 1, a configuration in which, for example, a cassette station 2 for transferring a plurality of wafers W per cassette as a unit thereinto/therefrom and a processing station 3 including a plurality of various kinds of units for performing predetermined processing or treatment for the wafers W in a manner of single wafer processing, are integrally connected.

The cassette station 2 includes a cassette mounting section 4 and a transfer path 5. In the cassette mounting section 4, cassettes C each capable of housing a plurality of substrates W can be mounted side by side in an X-direction (a top-to-bottom direction in FIG. 1). On the side of the positive direction in a Y-direction (the right direction in FIG. 1) to the cassette mounting section 4, the transfer path 5 that is long in an X-direction is adjacent. In the transfer path 5, for example, a transfer rail 10 extending in the X-direction and a main transfer unit 11 as a third substrate transfer unit moving on the transfer rail 10 are provided.

The main transfer unit 11 includes a multi-joint transfer arm 11a that is, for example, rotatable in a θ-direction and extensible in the horizontal direction. The main transfer unit 11 can transfer the wafer W to the cassettes C in the cassette mounting section 4 and later-described units 20 to 28 in the processing station 3.

The processing station 3 is provided on the side of the positive direction in the Y-direction to the transfer path 5. In the processing station 3, a cleaning unit 20 for cleaning the wafers W in a manner of single wafer processing, a planariz-ing film forming unit 21 for forming a planarizing film above the wafer W, and a patterning system A for performing patterning on a film to be processed above the wafer W are arranged. The patterning system A comprises, for example, a resist film forming unit 22 for forming a resist film above the wafer W, an exposure unit 23 for exposing the resist film above the wafer W to light, a post-exposure baking unit 24 for heating the exposed wafer W, a developing unit 25 for developing the resist film, a post-baking unit 26 for heating the wafer W after the development, an etching unit 27 for etching a resist pattern formed by the development, and a resist removing unit 28 for removing the resist pattern. Note that the post-exposure baking unit 24 and the post-baking unit 26 also have a function for cooling the wafer W.

The above-described cleaning unit 20, the planarizing film forming unit 21, and the resist film forming unit 22, the exposure unit 23, the post-exposure baking unit 24, the developing unit 25, the post-baking unit 26, the etching unit 27, and the resist removing unit 28 in the patterning system A are linearly arranged in this order along the transfer path 5. The units 20 to 28 are connected side by side on the side of the transfer path 5 so that the main transfer unit 11 can access each of the units 20 to 28 and transfer the wafer W between the units 20 to 28.

Between the planarizing film forming unit 21 and the resist film forming unit 22, a first sub-transfer unit 30 as a substrate transfer unit and a buffer cassette 31 as a substrate housing unit capable of temporarily housing a plurality of wafers W are provided. The first sub-transfer unit 30 has a multi-joint transfer arm 30a that is rotatable, for example, in the θ-direction and extensible in the horizontal direction, and can access the planarizing film forming unit 21, the resist film forming unit 22 and the buffer cassette 31 and transfer the wafer W to them.

Between the cleaning unit 20 and the planarizing film forming unit 21, a second sub-transfer unit 40 as a second substrate transfer unit, and a buffer cassette 41 as another substrate housing unit capable of temporarily housing a plurality of wafers W are provided. The second sub-transfer unit 40 has a multi-joint transfer arm 40a that is rotatable, for example, in the θ-direction and extensible in the horizontal direction, and can access the cleaning unit 20, the planarizing film forming unit 21, and the buffer cassette 41 and transfer the wafer W to them.

Figure 2:
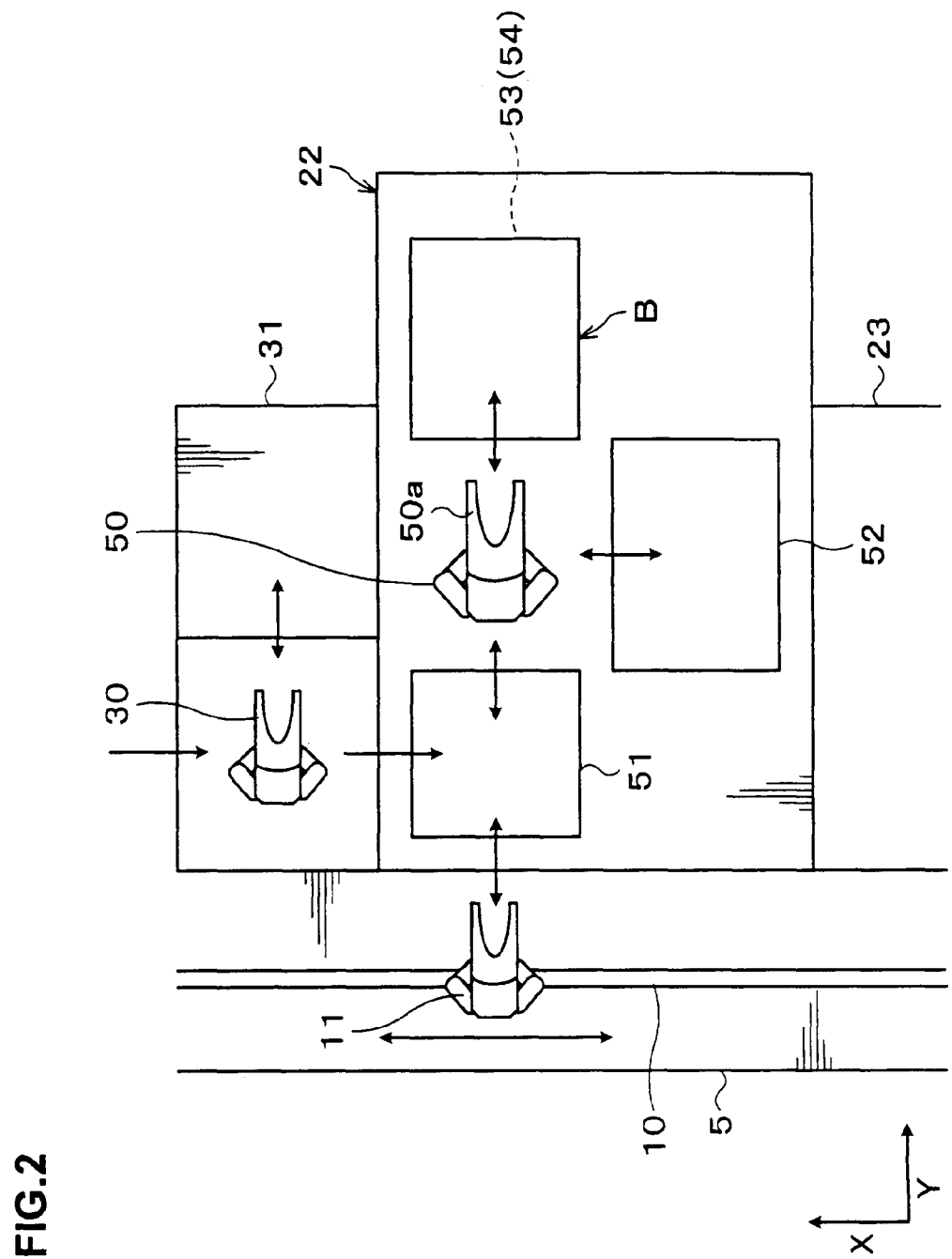
FIG. 2 is an explanatory view showing a configuration of a resist film forming unit in the substrate processing system.

The resist film forming unit 22 has a third sub-transfer unit 50, for example, at the center as shown in FIG. 2. Around the third sub-transfer unit 50, for example, a delivery table 51 for delivering the wafer W, a processing unit group B having a plurality of processing and treatment units at multiple tiers, and a resist coating unit 52 for applying a resist solution onto the wafer W, are provided. In the processing unit group B, for example, a plurality of thermal processing units 53 each for performing heating, cooling or temperature adjustment of the wafer W, an edge exposure unit 54 for exposing the edge portion of the wafer W to light, and so on are multi-tiered. The above-described main transfer unit 11 and the first sub-transfer unit 30 can access the delivery table 51 and transfer the wafer W to it. The third sub-transfer unit 50 has a multi-joint transfer arm 50a that is rotatable, for example, in the θ-direction and extensible in the horizontal direction, and can access the delivery table 51, the units 53 and 54 in the processing unit group B, and the resist coating unit 52 and transfer the wafer W to them.

The substrate processing system 1 includes, for example, as shown in FIG. 1, a control unit 60 which controls operations of the above-described units, the transfer units and so on to realize the pattern forming processing on a film to be processed above the wafer W. The control unit 60 is composed of, for example, a computer comprising a CPU and a memory, and can realize the pattern forming processing in the substrate processing system 1, for example, by executing programs stored in the memory.

Note that various kinds of programs for realizing the pattern forming processing in the substrate processing system 1 may be ones which have been stored in a storage medium H such as a computer-readable CD or the like and installed on the control unit 60 from the storage medium H.

In the control unit 60, for example, a program to manage the time from the completion of the cleaning treatment in the cleaning unit 20 to the start of the planarizing film forming processing in the planarizing film forming unit 21 to be constant, and a program to manage the time from the completion of the planarizing film forming processing in the planarizing film forming unit 21 to the start of the forming processing of the resist film in the resist film forming unit 22 (the start of subsequent round of patterning) to be constant, have been installed by means of the storage medium H.

Figure 3:
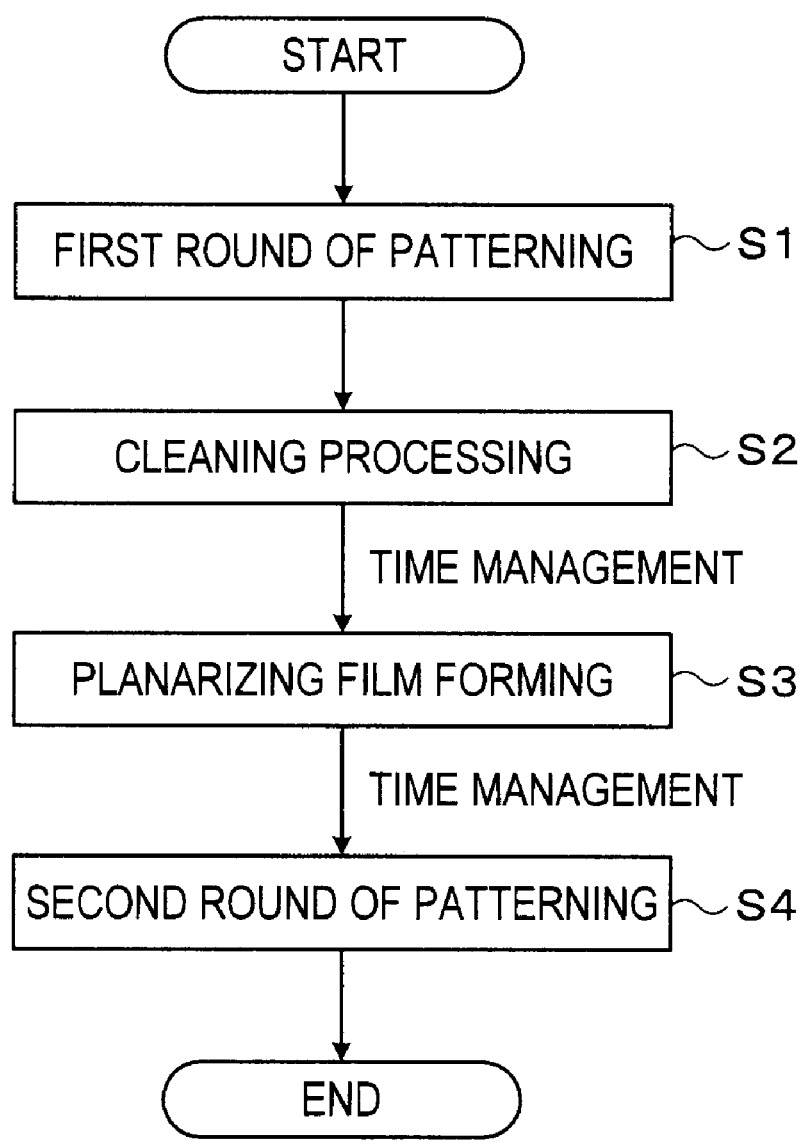
FIG. 3 is a flowchart of pattern forming processing.
Figure 4A:
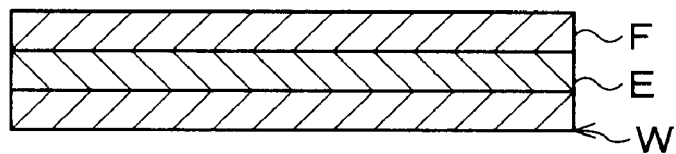
FIG. 4A is a longitudinal sectional view of a wafer before processing.

Next, the pattern forming process on the film to be processed above the wafer W which is performed using the above-described substrate processing system 1 will be described. FIG. 3 is a flowchart of this pattern forming process. Note that, in this embodiment, a case will be described taken as an example in which a lower-layer film E such as an organic lower-layer film has been formed on the surface of the wafer W, and an SOG (Spin On Glass) film F as the film to be processed as an upper-layer film on the lower-layer film E has been formed in advance as shown in FIG. 4A, and patterning is performed two rounds in total on the SOG film F.

Figure 4B:
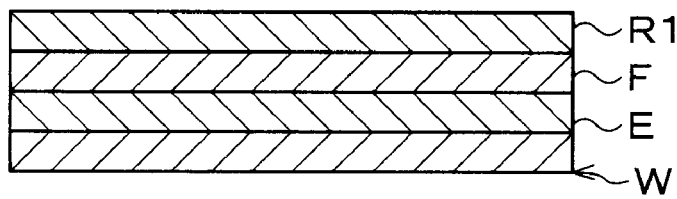
FIG. 4B is a longitudinal sectional view of the wafer above which a resist film in the first round is formed.

First of all, a first round of patterning is started (S1 in FIG. 3) in which a plurality of wafers W of the same lot in the cassette C shown in FIG. 1 are taken out by the main transfer unit 11 one by one, and successively transferred to the resist film forming unit 22 in the patterning system A. The wafer W transferred to the resist film forming unit 22 is first mounted by the main transfer unit 11 onto the delivery table 51 shown in FIG. 2. The wafer W is then transferred by the third sub-transfer unit 50 to the thermal processing unit 53 in the processing unit group B and temperature-adjusted to a predetermined temperature, and then transferred by the third sub-transfer unit 50 to the resist coating unit 52. In the resist coating unit 52, a chemically amplified resist solution is applied, for example, to the surface of the wafer W, whereby a resist film R1 in the first round is formed, for example, above the surface of the wafer W as shown in FIG. 4B.

The wafer W is then transferred by the third sub-transfer unit 50, for example, to the thermal processing unit 53 and subjected to pre-baking. The wafer W is then transferred to the edge exposure unit 54 so that the edge portion of the wafer W is exposed to light, and thereafter the wafer W is returned onto the delivery table 51 by the third sub-transfer unit 50. The wafer W is then transferred by the main transfer unit 11 to the adjacent exposure unit 23 shown in FIG. 1, where a predetermined pattern is exposed on the resist film R1 above the wafer W. After completion of the exposure processing, the wafer W is transferred by the main transfer unit 11 to the adjacent post-exposure baking unit 24 and subjected to post-exposure baking.

Figure 4C:
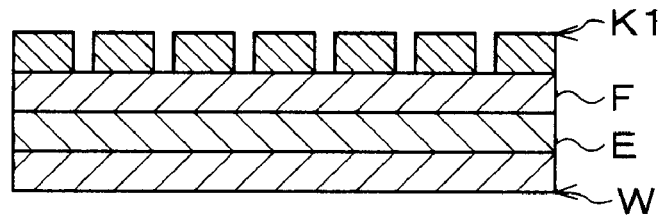
FIG. 4C is a longitudinal sectional view of the wafer above which a resist pattern in the first round is formed.
Figure 4D:
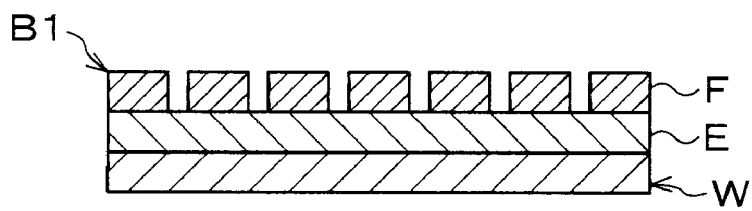
FIG. 4D is a longitudinal sectional view showing a state in which a pattern in the first round is formed in a film to be processed.

The wafer W is then transferred by the main transfer unit 11 to the adjacent developing unit 25, so that the resist film R1 above the wafer W is developed. The wafer W is then transferred by the main transfer unit 11 to the adjacent post-baking unit 26 and subjected to post-baking. Thus, a resist pattern K1 is formed above the surface of the wafer W as shown in FIG. 4C. The wafer W is then transferred by the main transfer unit 11 to the adjacent etching unit 27 shown in FIG. 1, where the SOG film F being the film to be processed is etched using the resist pattern K1 as a mask. The wafer W is thereafter transferred by the main transfer unit 11 to the resist removing unit 28, where the resist pattern K1 no longer required is removed. Thus, the first round of patterning is completed, resulting in formation of a predetermined pattern B1 in the SOG film F above the wafer W as shown in FIG. 4D.

The wafers W on which the first round of patterning has been completed are successively held, for example, by the main transfer unit 11 shown in FIG. 1 and moved in the transfer path 5 and transferred from the resist removing unit 28 to the cleaning unit 20. In the cleaning unit 20, the surface of the wafer W is cleaned (S2 in FIG. 3).

After cleaning, the wafer W is temporarily housed in the adjacent buffer cassette 41 by the second sub-transfer unit 40 and waiting therein. The wafer W is then transferred by the second sub-transfer unit 40 from the buffer cassette 41 to the planarizing film forming unit 21. By adjusting the waiting time for each wafer W in the buffer cassette 41 in this event, a time T1 from the completion of the cleaning treatment for the wafer W in the cleaning unit 20 to the start of the forming processing of the planarizing film in the planarizing film forming unit 21 is controlled to be constant among the wafers. This manages the time T1 for each wafer W to a constant set time which has been previously determined.

Figure 5:
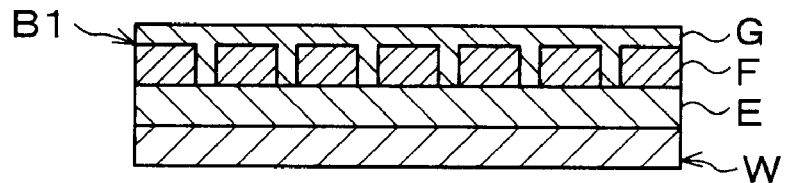
FIG. 5 is a longitudinal sectional view of the wafer above which a planarizing film is formed.

When the wafer W is transferred to the planarizing film forming unit 21, a planarizing film G is formed above the surface of the wafer W as shown in FIG. 5 (S3 in FIG. 3). The wafer W is then temporarily housed in the adjacent buffer cassette 31 shown in FIG. 1 by the first sub-transfer unit 30 and waiting therein. The wafer W is then transferred by the first sub-transfer unit 30 from the buffer cassette 31 to the resist film forming unit 22 in the patterning system A. By adjusting the waiting time for each wafer W in the buffer cassette 31 in this event, a time T2 from the completion of the forming processing of the planarizing film in the planarizing film forming unit 21 to the start of the forming processing of the resist film in the resist film forming unit 22 (the start of the second round of patterning) is controlled to be constant among the wafers. This manages the time T2 for each wafer W to a constant set time which has been previously determined.

Figure 6A:
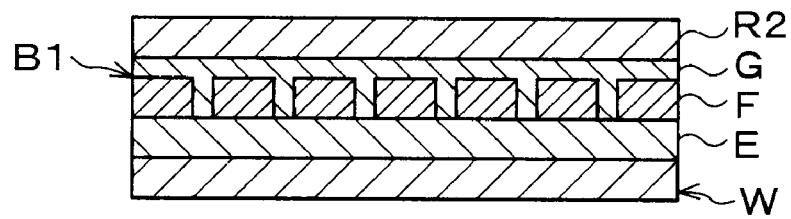
FIG. 6A is a longitudinal sectional view of the wafer above which a resist film in the second round is formed.

When the wafer W is transferred to the resist film forming unit 22, the second round of patterning is started (S4 in FIG. 3). In the second round of patterning, as in the first round of patterning, the wafer W is first transferred by the third sub-transfer unit 50 to the thermal processing unit 53 and temperature-adjusted, and then transferred to the resist coating unit 52, where a resist film R2 in the second round is formed on the planarizing film G as shown in FIG. 6A.

Figure 6B:
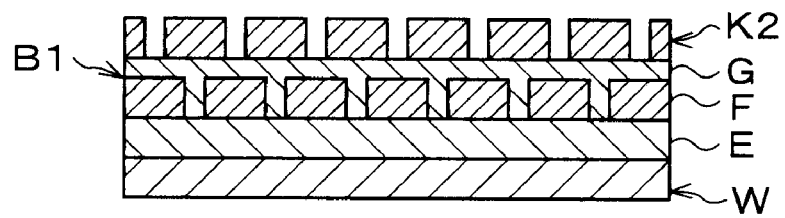
FIG. 6B is a longitudinal sectional view of the wafer above which a resist pattern in the second round is formed.
Figure 6C:
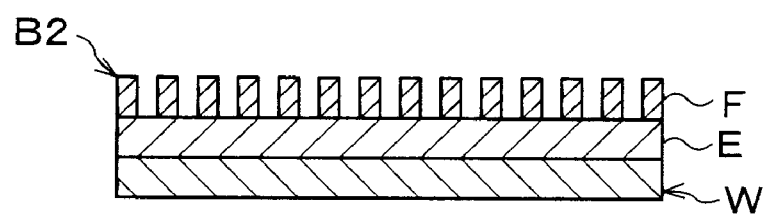
FIG. 6C is a longitudinal sectional view of the wafer with a final pattern formed in the film to be processed.

The wafer W is then transferred to the thermal processing unit 53 and the edge exposure unit 54 in sequence and subjected to pre-baking and edge exposure processing, and then transferred by the main transfer unit 11 to the exposure unit 23 shown in FIG. 1. In the exposure unit 23, the resist film R2 above the wafer W is exposed to light in a predetermined pattern. After completion of the exposure, the wafer W is transferred by the main transfer unit 11 to the post-exposure baking unit 24 and subjected to post-exposure baking, and then transferred to the developing unit 25 and subjected to development. The wafer W is then transferred by the main transfer unit 11 to the post-baking unit 26 and subjected to post-baking. Thus, a resist pattern K2 in the second round is formed as shown in FIG. 6B. The wafer W is then transferred by the main transfer unit 11 to the etching unit 27 shown in FIG. 1, where the planarizing film G and the SOG film F are etched using the resist pattern K2 as a mask. The wafer W is thereafter transferred by the main transfer unit 11 to the resist removing unit 28, where the resist pattern K2 and the planarizing film G are removed. Thus, the second round of patterning is completed, resulting in formation of a final pattern B2 in the SOG film F above the wafer W as shown in FIG. 6C.

The wafers W above which the pattern B2 has been formed are returned in succession by the main transfer unit 11 from the resist removing unit 28 into the cassette C, with which a series of pattern forming processing ends. Note that the pattern forming processing is performed such that a plurality of wafers W in each lot for the same recipe are successively transferred.

According to the above embodiment, the time T2 from the completion of the forming processing of the planarizing film to the start of the subsequent round of patterning is managed to be constant among the wafers, thus making the volatilization volume of a volatile component in the planarizing film G and the amount of moisture or the like adhering to the planarizing film G the same among the wafers, resulting in a constant oxygen concentration on the surface of the planarizing film G. As a result, the acid concentration of the resist film R2 formed on the planarizing film G is constant among the wafers, so that the shape of the resist pattern K2 which is formed by development of the resist film R2 is stabilized to have a desired dimension. Accordingly, the pattern B with a desired dimension can be finally stably formed in the SOG film F.

By the way, the molecular contamination, the amount of adhering moisture, and the volatilization volume of a volatile component on the surface of the wafer W from the completion of the cleaning treatment to the start of the forming processing of the planarizing film affect the coating property and the embedding property of the planarizing film G. In the above embodiment, the time T1 from the completion of the cleaning treatment for the wafer W to the start of the forming processing of the planarizing film is managed to be constant among the wafers, so that the film thickness and the embedding state of the coating solution of the planarizing film G can be made uniform to further stabilize the shape of the resist pattern K2. As a result, the dimension of the final resist pattern B can be further stabilized.

In the above embodiment, the first sub-transfer unit 30 and the buffer cassette 31 are provided between the planarizing film forming unit 21 and the resist film forming unit 22, thereby enabling easy management of the time T2 from the completion of the forming processing of the planarizing film to the start of the subsequent round of patterning. In addition, the second sub-transfer unit 40 and the buffer cassette 41 are provided between the cleaning unit 20 and the planarizing film forming unit 21, thereby enabling easy management of the time T1 from the completion of the cleaning treatment to the start of the planarizing film forming processing.

The cleaning unit 20, the planarizing film forming unit 21, and the patterning system A are linearly arranged in this order and the main transfer unit 11 which performs transfer of the wafer W between the cleaning unit 20 and the resist removing unit 28 in the patterning system A is provided in the substrate processing system 1, so that the wafer W can be processed by being circulated from the patterning system A, the cleaning unit 20, the planarizing film forming unit 21 to the patterning system A in this order.

Thus, two rounds of patterning can be preferably performed in the substrate processing system 1. Further, since the cleaning unit 20 is adjacent to the planarizing film forming unit 21, and the planarizing film forming unit 21 is adjacent to the patterning system A, the time T1 between the cleaning treatment and the planarizing film forming processing and the time T2 between the planarizing film forming processing and the patterning are easily managed.

Furthermore, the units 22 to 28 in the patterning system A are connected to the side of the transfer path 5 and provided along the transfer path 5 so that the main transfer unit 11 can transfer the wafer W also between the units 22 to 28 in the patterning system A. This allows appropriate transfer of the wafer W during the patterning in which the wafer W is circulated to a plurality of units.

Note that though the transfer of the wafer W between the units 22 to 28 in the patterning system A is performed by the main transfer unit 11 in the above embodiment, substrate transfer units may be individually provided between adjacent units.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention.

The number of rounds of patterning is two in the above embodiment, and the present invention is also applicable to the case of three rounds or more. Also in the case of three rounds or more, the time T2 from the planarizing film forming processing performed between successive rounds of patterning to the start of the subsequent round of patterning and time T1 from the completion of the cleaning treatment to the start of the forming processing of the planarizing film are managed to be constant among the wafers.

Besides, the film to be processed in which the pattern is to be formed is not limited to the SOG film but may be other kinds of films. The arrangement of units in the processing station 3 is not limited to that in the above embodiment but may be another arrangement of units according to the pattern to be formed. Further, a detecting unit which detects the line width of the pattern, the film thickness of the coating film and the like may be provided in the arrangement of units in the substrate processing system so that the state of the first round of patterning after etching may be monitored so as to conduct control such that the heating temperature in the thermal processing unit and the developing time in the developing unit are changed based on the monitoring to optimize the second round of patterning processing. Furthermore, the present invention is also applicable to processing for substrates other than the wafer, such as an FPD (Flat Panel Display), a mask reticle for a photomask, and the like.

The present invention is useful in stably forming a pattern with a desired dimension by a plurality of rounds of patterning.

What is claimed is:

1. A substrate processing method of performing a plurality of rounds of patterning on a film to be processed located at a same layer above a surface of a substrate, said processing being performed on a plurality of substrates, said method comprising steps of:
    forming a planarizing film above the substrate between successive rounds of patterning of the plurality of rounds of patterning; and
    then forming a resist film on the planarizing film, for a second round of patterning of the successive rounds of patterning,
    wherein time from completion of said step of forming the planarizing film to start of subsequent round of patterning is made constant among the substrates.

2. The substrate processing method as set forth in claim 1, further comprising the step of:
   cleaning the substrate immediately before said step of forming a planarizing film,
   wherein time from completion of said step of cleaning the substrate to start of said step of forming the planarizing film is made constant among the substrates.

3. The substrate processing method as set forth in claim 1, further comprising:
   cleaning the substrate immediately before said step of forming the planarizing film,
   wherein time from completion of said step of cleaning the substrate to start of said step of forming the planarizing film is made constant among the substrates,
   the step of cleaning is performed with a cleaning unit, the step of forming the planarizing film is performed with a planarizing film forming unit, and the each of the rounds of patterning is performed with a patterning system, and
   the cleaning unit, the planarizing film forming unit, and the patterning system are linearly arranged in this order.

4. The substrate processing method as set forth in claim 1, further comprising:
   temperature adjusting the substrate after the formation of the planarizing film; and
   then performing a second round of patterning of the successive rounds of patterning.

5. The substrate processing method as set forth in claim 1, further comprising:
   making a volatilization volume of a volatile component in the planarizing film and an amount of moisture adhering to the planarizing film same among the substrates.

6. A substrate processing method of performing a plurality of rounds of patterning on a film to be processed located at a same layer above a surface of a substrate, said processing being performed on a plurality of substrates, said method comprising:
   forming a planarizing film above the substrate between successive rounds of patterning of the plurality of rounds of patterning; and
   temporarily housing the substrate above which the planarizing film has been formed into a substrate housing unit and keeping the substrate waiting therein to adjust a waiting time in the substrate housing unit, wherein time from completion of said step of forming a planarizing film to start of subsequent round of patterning is made constant among the substrates.

7. The substrate processing method as set forth in claim 6, further comprising:
   cleaning the substrate immediately before said step of forming a planarizing film,
   wherein time from completion of said step of cleaning the substrate to start of said step of forming the planarizing film is made constant among the substrates by temporarily housing the substrate after the cleaning into another substrate housing unit and keeping the substrate waiting therein to adjust a waiting time in the another substrate housing unit.

8. The substrate processing method as set forth in claim 6, further comprising:
   making a volatilization volume of a volatile component in the planarizing film and an amount of moisture adhering to the planarizing film same among the substrates.

* * * * *